(12) United States Patent
Mao et al.

(10) Patent No.: US 9,406,598 B2
(45) Date of Patent: Aug. 2, 2016

(54) PACKAGE WITH A FAN-OUT STRUCTURE AND METHOD OF FORMING THE SAME

(71) Applicant: Taiwan Semiconductor Manufacturing Company, Ltd., Hsin-Chu (TW)

(72) Inventors: Yi-Chao Mao, Zhongli (TW);
Chin-Chuan Chang, Zhudong Township (TW); Jui-Pin Hung, Hsin-Chu (TW); Jing-Cheng Lin, Chu Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/319,678

(22) Filed: Jun. 30, 2014

(65) Prior Publication Data
US 2014/0312492 A1    Oct. 23, 2014

Related U.S. Application Data

(62) Division of application No. 13/691,536, filed on Nov. 30, 2012, now Pat. No. 8,785,299.

(51) Int. Cl.
| | | |
|---|---|---|
| *H01L 29/40* | (2006.01) | |
| *H01L 23/498* | (2006.01) | |
| *H01L 23/48* | (2006.01) | |
| *H01L 21/683* | (2006.01) | |
| *H01L 23/00* | (2006.01) | |

(Continued)

(52) U.S. Cl.
CPC ........ *H01L 23/49811* (2013.01); *H01L 21/568* (2013.01); *H01L 21/6835* (2013.01); *H01L 23/3135* (2013.01); *H01L 23/48* (2013.01); *H01L 24/19* (2013.01); *H01L 24/97* (2013.01); *H01L 21/561* (2013.01); *H01L 21/6836* (2013.01); *H01L 23/3128* (2013.01); *H01L 23/3192* (2013.01); *H01L 2221/68327* (2013.01); *H01L 2221/68372* (2013.01); *H01L 2224/12105* (2013.01); *H01L 2224/13* (2013.01); *H01L 2924/12042* (2013.01); *H01L 2924/15787* (2013.01); *H01L 2924/181* (2013.01); *H01L 2924/18162* (2013.01); *H01L 2924/3511* (2013.01)

(58) Field of Classification Search
CPC ............ H01L 23/3157; H01L 23/3185; H01L 23/315; H01L 23/49811; H01L 23/3135
USPC .......... 257/738, 783, 792, E23.119, E23.128; 438/118, 127
See application file for complete search history.

(56) References Cited

U.S. PATENT DOCUMENTS

| | | | |
|---|---|---|---|
| 6,197,613 B1 * | 3/2001 | Kung | .................. H01L 23/3107 257/E21.508 |
| 2004/0009631 A1 | 1/2004 | Connell | |

(Continued)

*Primary Examiner* — Kimberly Rizkallah
*Assistant Examiner* — Maria Ligai
(74) *Attorney, Agent, or Firm* — Slater Matsil, LLP

(57) ABSTRACT

An embodiment is a device comprising a semiconductor die, an adhesive layer on a first side of the semiconductor die, and a molding compound surrounding the semiconductor die and the adhesive layer, wherein the molding compound is at a same level as the adhesive layer. The device further comprises a first post-passivation interconnect (PPI) electrically coupled to a second side of the semiconductor die, and a first connector electrically coupled to the first PPI, wherein the first connector is over and aligned to the molding compound.

20 Claims, 15 Drawing Sheets

(51) Int. Cl.
*H01L 23/31* (2006.01)
*H01L 21/56* (2006.01)

(56) References Cited

U.S. PATENT DOCUMENTS

| | | |
|---|---|---|
| 2004/0232543 A1 | 11/2004 | Goller |
| 2005/0019982 A1* | 1/2005 | Wakabayashi ...... H01L 23/5389 438/108 |
| 2005/0121765 A1* | 6/2005 | Lin ................... H01L 23/49816 257/686 |
| 2006/0046347 A1* | 3/2006 | Wood ..................... H01L 21/56 438/106 |
| 2008/0014681 A1 | 1/2008 | Jobetto |
| 2009/0230527 A1 | 9/2009 | Shen |
| 2012/0187568 A1* | 7/2012 | Lin ................... H01L 21/76898 257/774 |

* cited by examiner

PACKAGE WITH A FAN-OUT STRUCTURE AND METHOD OF FORMING THE SAME

PRIORITY CLAIM AND CROSS-REFERENCE

This application is a divisional of, and claims the benefit of, U.S. patent application Ser. No. 13/691,536, filed on Nov. 30, 2012, titled "Package with a Fan-out Structure and Method of Forming the Same," which application is hereby incorporated by reference.

BACKGROUND

With the evolving of semiconductor technologies, semiconductor dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a high throughput and a low cost. Further, less underfill or molding compound is needed. This packaging technology, however, also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means that the I/O pads on a die can be redistributed to a greater area than the die, and hence the number of I/O pads packed on the surfaces of the dies can be increased.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
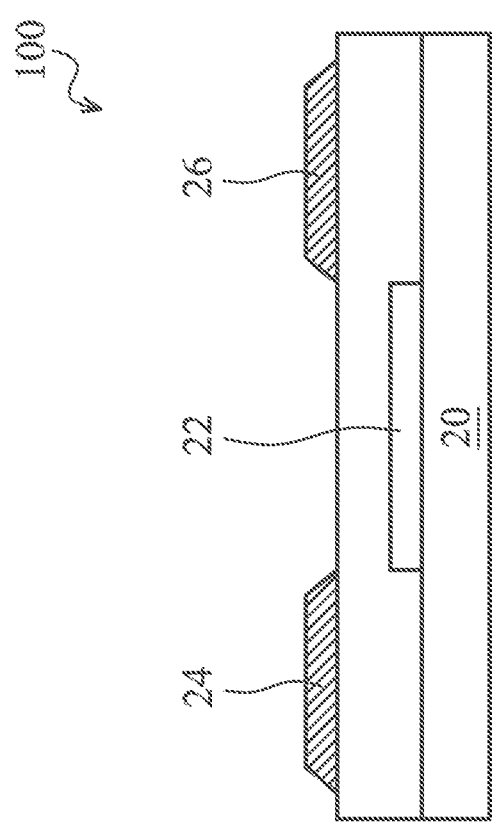
FIGS. 1 through 14 are cross-sectional views of intermediate stages in the manufacturing of a package in accordance with an exemplary embodiment.

Various steps in the manufacturing of a package structure with a fan-out structure will be described with reference to FIGS. 1 through 14. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a package structure with a fan-out structure. With reference now to FIG. 1, there is shown a die 100 at an intermediate stage of processing including a substrate 20, a first bond pad 24, and a second bond pad 26. The substrate 20 may be silicon, silicon germanium, silicon carbide, a ceramic substrate, a quartz substrate, the like, or a combination thereof. The substrate 20 may comprise bulk silicon, doped or undoped, or an active layer of a silicon-on-insulator (SOI) substrate. Other substrates that may be used include multi-layered substrates, gradient substrates, or hybrid orientation substrates.

The substrate 20 may include integrated circuit devices 22. As one of ordinary skill in the art will recognize, a wide variety of integrated circuit devices 22 such as transistors, capacitors, resistors, combinations of these, or the like may be used to generate the structural and functional requirements of the design for the die 100. The integrated circuit devices 22 may be formed using any suitable methods.

The substrate 20 may also include an interconnect structure (not shown). The interconnect structure may be formed over the integrated circuit devices 22 and are designed to connect the various integrated circuit devices 22 to form functional circuitry. The interconnect structure may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown) to electrically couple the integrated circuit devices 22 to the first bond pad 24 and/or the second bond pad 26. Only a portion of the substrate 20 is illustrated in the figures, as this is sufficient to fully describe the illustrative embodiments.

The first and second bond pads 24 and 26 may be formed over an in electrical contact with the interconnect structure (not shown) in order to help provide external connections to the integrated circuit devices. The first and second bond pads 24 and 26 may comprise aluminum, copper, nickel, the like, or a combination thereof. The first and second bond pads 24 and 26 may be formed using a deposition process, such as sputtering, to form a layer of material (not shown). Portions of the layer of material may then be removed through a suitable process, such as photolithographic masking and etching, to form the first and second bond pads 24 and 26. However, any other suitable process may be utilized to form the first and second bond pads 24 and 26. The first and second bond pads 24 and 26 may be formed to have a thickness of between about 0.5 µm and about 4 µm.

Figure 2:
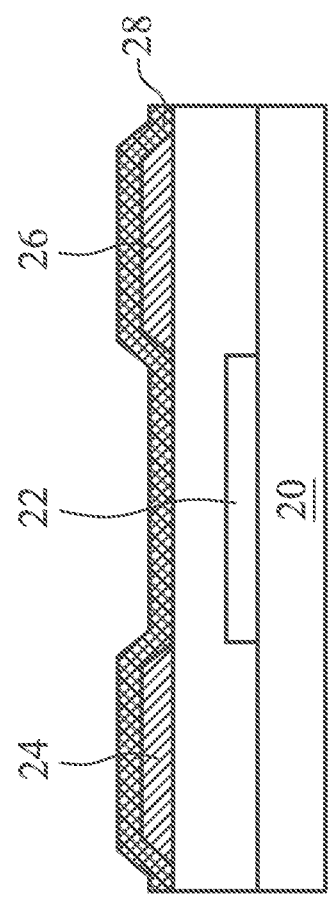

A first passivation layer 28 may be formed on the substrate 20 and over the first bond pad 24 as illustrated in FIG. 2. The first passivation layer 28 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The first passivation layer 28 may be formed through a process such as chemical vapor deposition (CVD), although any suitable process may be utilized, and may have a thickness between about 0.5 µm and about 30 µm. In some embodiments, a top surface of first bond pad 24, a top surface of the second bond pad, and a portion of bottom surface of the first passivation layer 28 are substantially level.

Figure 3:
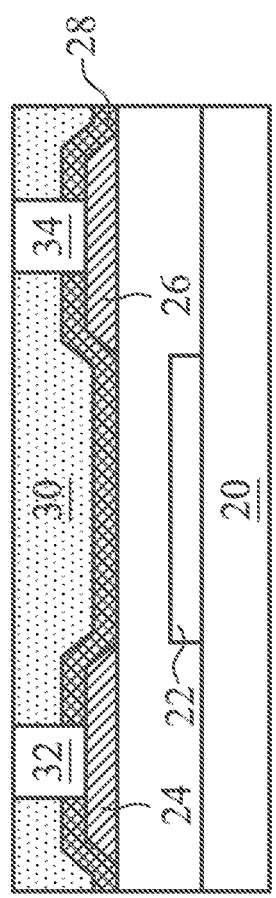

FIG. 3 illustrates the formation of a second passivation layer 30 over the first passivation layer 28, a first metal pillar 32 in the first and second passivation layers 28 and 30 and electrically coupled to the first bond pad 24, and a second metal pillar 34 in the first and second passivation layers 28 and 30 and electrically coupled to the second bond pad 26.

The second passivation layer 30 may be formed over the first passivation layer 28. The second passivation layer 30 may be formed from a polymer such as polyimide. Alternatively, the second passivation layer 30 may be formed of a material similar to the material used as the first passivation layer 28, such as silicon oxides, silicon nitrides, low-k dielectrics, extremely low-k dielectrics, BCB, PBO, the like, or a combination thereof. The second passivation layer 30 may be formed to have a thickness between about 2 µm and about 15 µm.

After the second passivation layer 30 has been formed, the first metal pillar 32 may be formed over the first bond pad 24 in order to allow for physical and electrical contact to the first bond pad 24 through the first and second passivation layers 28 and 30. At a same time and with a same process as the formation of the first metal pillar 32, the second metal pillar may be formed over the second bond pad 26 in order to allow for physical and electrical contact to the second bond pad 26 through the first and second passivation layers 28 and 30.

The first and second metal pillars 32 and 34 may be formed by forming openings in the first and second passivation layers 28 and 30 by, for example, etching, milling, laser techniques, combinations of these, or the like. A thin barrier layer (not shown) may be conformally deposited on the second passivation layer 30 and in the openings, such as by CVD, atomic layer deposition (ALD), the like, or a combination thereof. The barrier layer may comprise a nitride or an oxynitride, such as titanium nitride, titanium oxynitride, tantalum nitride, tantalum oxynitride, tungsten nitride, silicon dioxide, the like, or a combination thereof. A conductive material may be deposited over the thin barrier layer and in the openings. The conductive material may be formed by an electro-chemical plating process, CVD, ALD, physical vapor deposition (PVD), the like, or a combination thereof. The conductive material may be copper, tungsten, aluminum, silver, gold, the like, or a combination thereof. The conductive material may then be patterned to form the first and second metal pillars 32 and 34.

In an embodiment, a top surface of the first metal pillar 32 may be substantially level with a top surface of the second passivation layer 30 and a top surface of the second metal pillar 34. In another embodiment, the top surface of the first metal pillar 32 and/or the top surface the second metal pillar 34 may be lower than the top surface of the second passivation layer 30 with a thin portion of the second passivation layer 30 covering the first metal pillar 32 and/or the second metal pillar 34.

Figure 4:
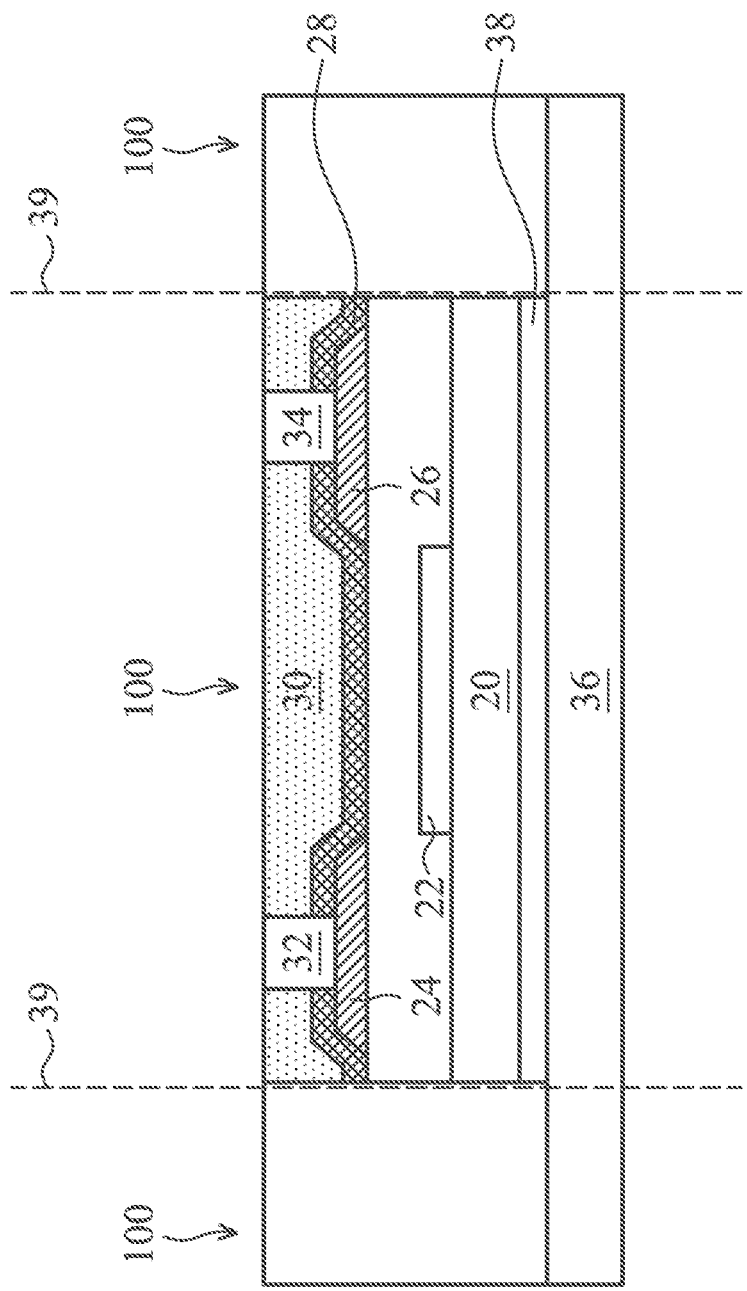

FIG. 4 illustrates affixing the die 100 on a dicing tape 36. The dicing tape 36 may provide temporary mechanical and structural support during subsequent singulation of the die 100 from adjacent dies 100. The die 100 may be affixed or bonded to the dicing tape 36 wherein the dicing tape 36 may comprise an embedded adhesive layer 38. As shown in FIG. 4, there may be a plurality of dies 100 on a wafer identical to each other placed on the dicing tape 36.

Singulation may be performed along scribe lines 39 to form a single die 100. The singulation may be performed through a cutting or singulation process wherein a mechanical or laser saw may be used to separate multiple dies 100 from each other. The separated dies 100 may be removed or de-bonded from the dicing tape 36 following singulation.

Figure 5:
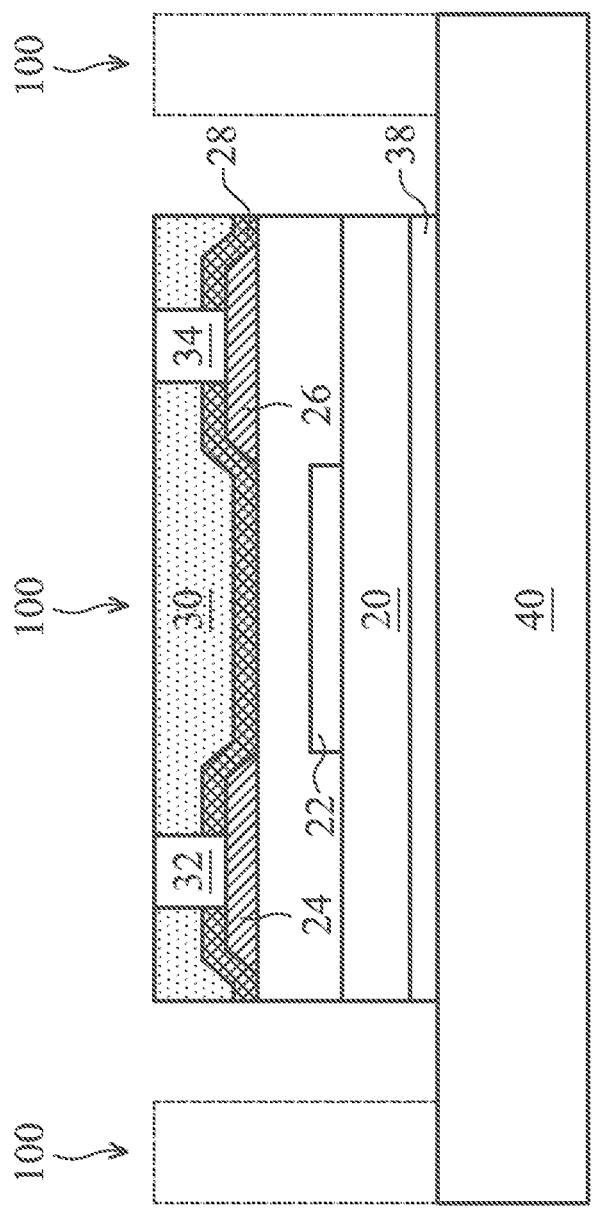

FIG. 5 illustrates the mounting of die 100 on a first carrier substrate 40. The first carrier substrate 40 may provide temporary mechanical and structural support during the subsequent processing steps. The die 100 may be mounted to the first carrier substrate 40 using the already existing adhesive layer 38. Although a single die 100 is illustrated, there may be a plurality of dies 100 identical to each other placed on the first carrier substrate 40. In the embodiments wherein die 100 includes the substrate 20, a bottom surface of substrate 20 contacts the adhesive layer 38 with the sides of the substrate 20 and the adhesive layer 38 being coterminous. In some embodiments, spaces are left between neighboring dies 100 wherein there is no adhesive layer in the spaces. In an embodiment, the first carrier substrate 40 may comprise glass, silicon oxide, aluminum oxide, the like, or a combination thereof. The adhesive layer 38 may be any suitable adhesive, such as a die attach film or the like.

Figure 6:
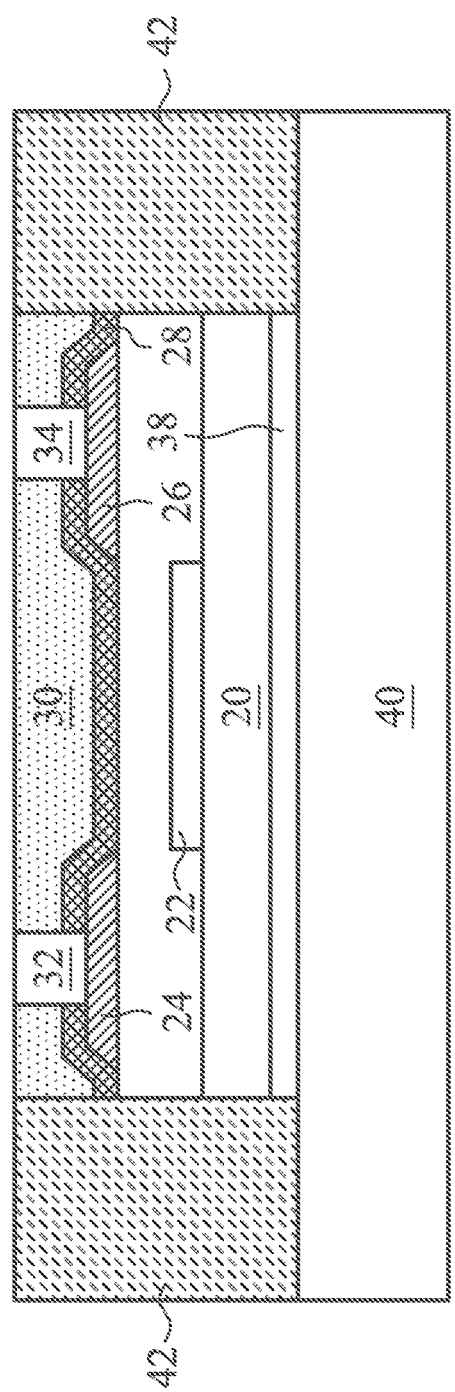

FIG. 6 illustrates the molding of polymer 42 on die 100. Polymer 42 may be a molding compound, and hence is referred to as molding compound 42 hereinafter, although it may also be formed of other materials. Molding compound 42 may comprise an organic material such as an epoxy, which is filled into the spaces between dies 100. The top surface of die 100 may also be covered by molding compound 42. In an embodiment, a bottom surface of the molding compound 42 contacts the first carrier substrate 40. A curing process may be performed to solidify molding compound 42.

As also shown in FIG. 6, a planarization, such as a grinding, may be performed on molding compound 42 until the first metal pillar 32 and the second metal pillar 34, and possibly the second passivation layer 30, are exposed. Accordingly, the top surface of the second passivation layer 30, the top surface of the first metal pillar 32, the top surface of the second metal pillar 34, and the top surface of the molding compound 42 may be substantially level with each other. In the embodiments wherein the first metal pillar 32 and/or the second metal pillar 34 are embedded in the second passivation layer 30, a layer of the second passivation layer 30 may also be grinded. As a result of the grinding, there may not be molding compound 42 over die 100. In a top view of the structure in FIG. 6, the die 100 is encircled by the molding compound 42.

Figure 7:
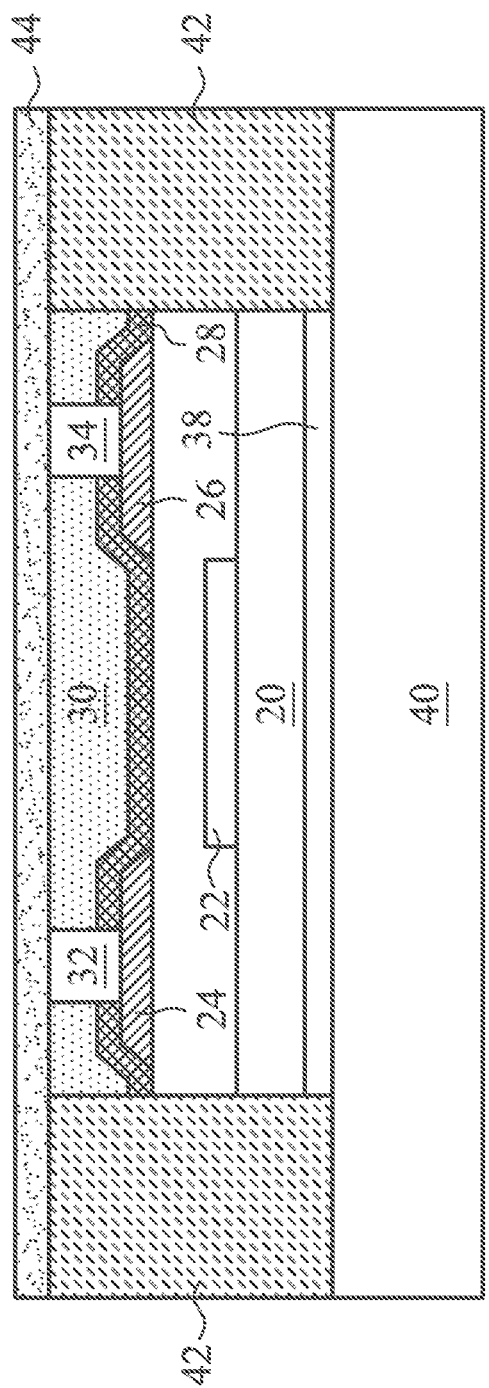

FIG. 7 illustrates the formation of a first dielectric layer 44 over the molding compound 42, the second passivation layer 30, the first metal pillar 32, and the second metal pillar 34. The first dielectric layer 44 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, PBO, BCB, the like, or a combination thereof. The first dielectric layer 44 may be formed through a process such as chemical vapor deposition (CVD), although any suitable process may be utilized.

Figure 8:
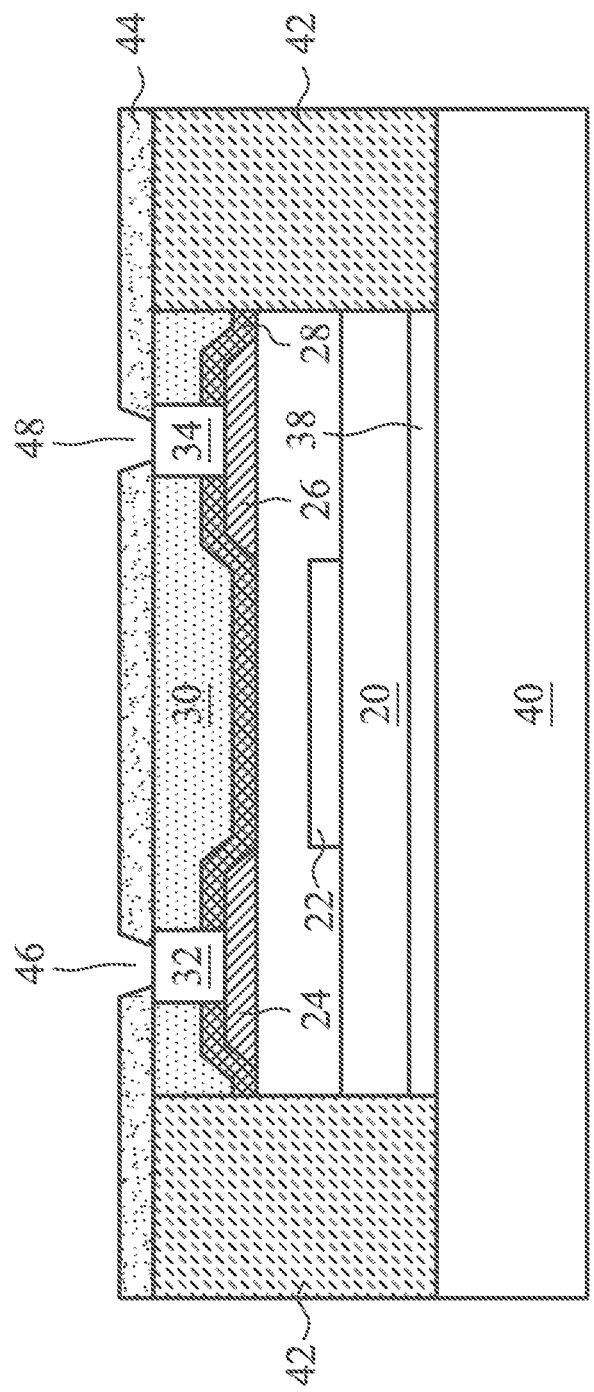

After the first dielectric layer 44 is formed, a first opening 46 and a second opening 48 may be formed through the first dielectric layer 44 as illustrated in FIG. 8. The first opening 46 may be formed in the first dielectric layer 44 to expose a portion of the first metal pillar 32, and the second opening 48 may be formed in the first dielectric layer 44 to expose a portion of the second metal pillar 34. The first and second openings 46 and 48 may be formed, for example, by etching, milling, laser techniques, combinations of these, or the like. In some embodiments, the first opening 46 may be formed simultaneously with the second opening 48.

Figure 9:
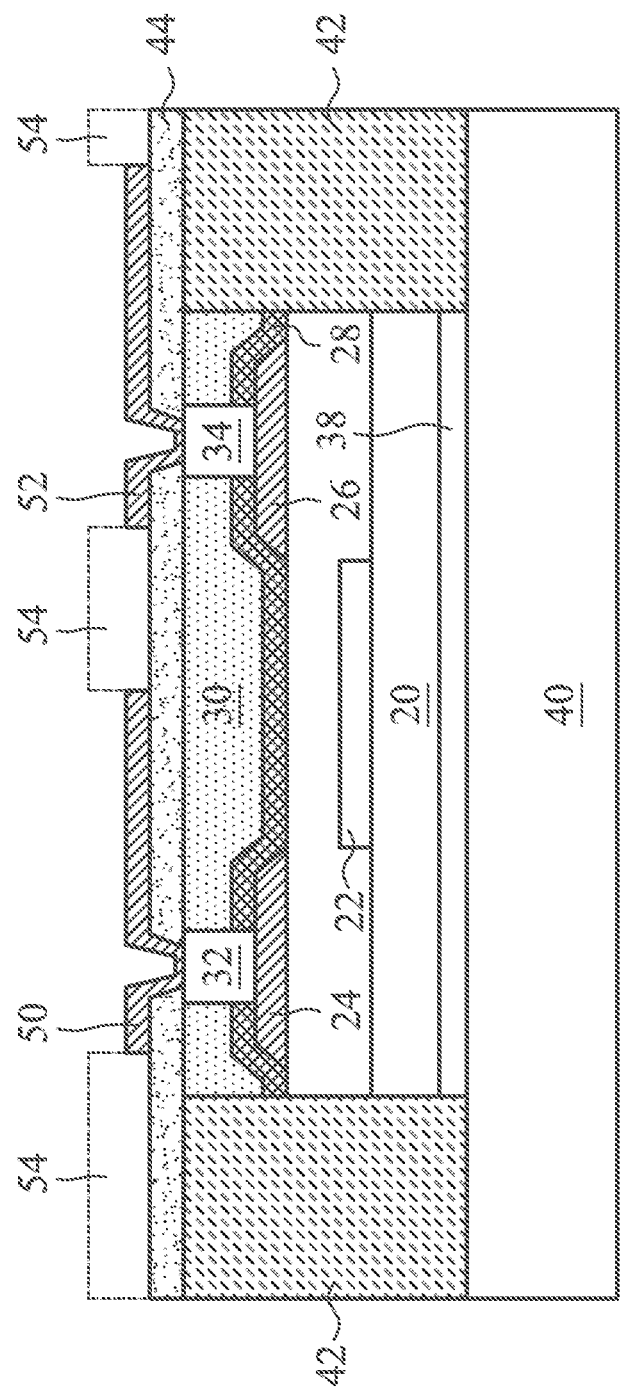

FIG. 9 illustrates the formation of a first post-passivation interconnect (PPI) 50 in the first opening 46 and a second PPI 52 in the second opening 48. The first PPI 50 may provide electrical connection between the first metal pillar 32 and the subsequently formed first under-bump metallization (UBM) 62 (see FIG. 11), and the second PPI 52 may provide electrical connections between the second metal pillar 34 and the subsequently formed second UBM 64 (see FIG. 11). In an embodiment, the first and second PPIs 50 and 52 may comprise copper, tungsten, aluminum, silver, gold, the like, or a combination thereof. In some embodiments, the first and second PPIs 50 and 52 may include a barrier layer as discussed above in reference to the first metal pillar 32 and the second metal pillar 34. The first and second PPIs 50 and 52 may be formed by forming and patterning a photo resist layer 54, and then forming the first and second PPIs 50 and 52 by an electro-chemical plating process, CVD, ALD, PVD, the like, or a combination thereof. After the first and second PPIs are formed, the photo resist layer 54 may be removed.

Figure 10:
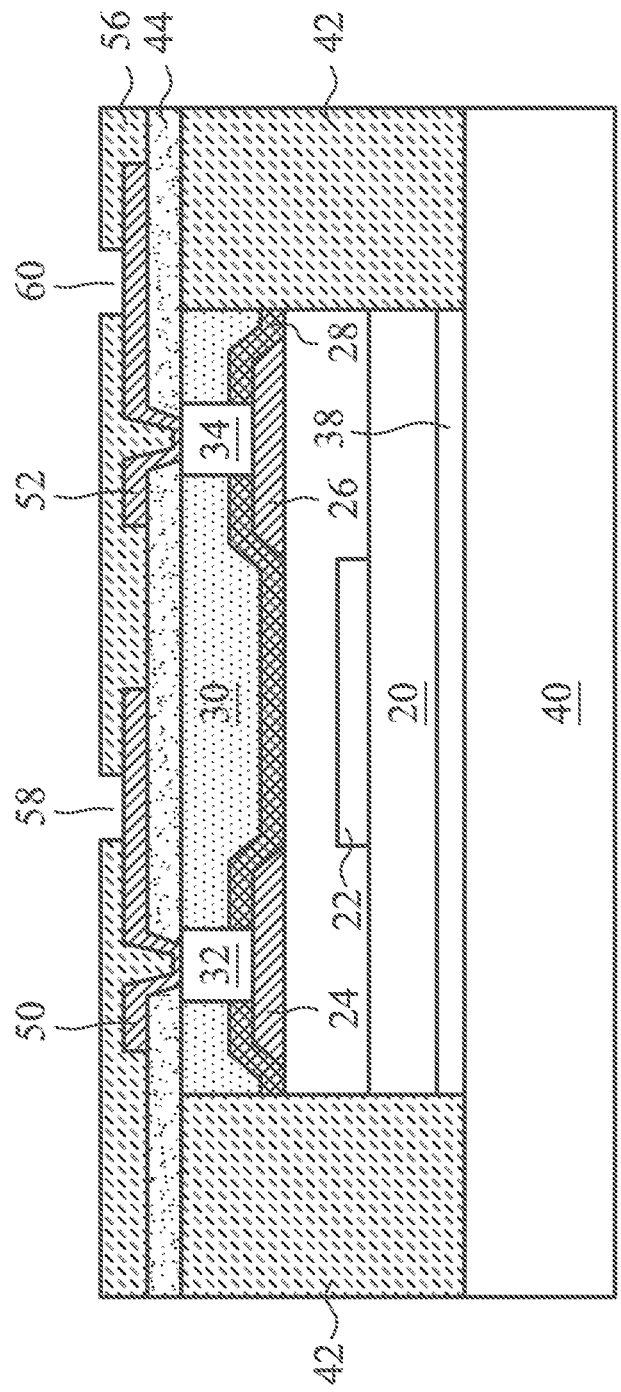

FIG. 10 illustrates the formation of a second dielectric layer 56 over the first dielectric layer 44, the first PPI 50, and the second PPI 52. In an embodiment, the second dielectric layer 56 may comprise similar materials as the first dielectric layer, such as, silicon oxide, silicon nitride, carbon doped oxides, porous carbon doped silicon dioxide, polyimide, PBO, BCB, the like, or a combination thereof, although they need not be formed of the same material. The second dielectric layer 56 may be formed through a process such as chemical vapor deposition (CVD), although any suitable process may be utilized.

After the second dielectric layer 56 is deposited, a third opening 58 and a fourth opening 60 may be formed. The third opening 58 may be formed in the second dielectric layer 56 to expose a portion of the first PPI 50, and the fourth opening 60 may be formed in the second dielectric layer 56 to expose a portion of the second PPI 52. At least one of the third opening 58 and the fourth opening 60 may be formed over and aligned with the molding compound 42, with the other opening over and aligned with the second passivation layer 30. The first and second openings 46 and 48 may be formed, for example, by etching, milling, laser techniques, combinations of these, or the like. In some embodiments, the first opening 46 may be formed simultaneously with the second opening 48.

Figure 11:
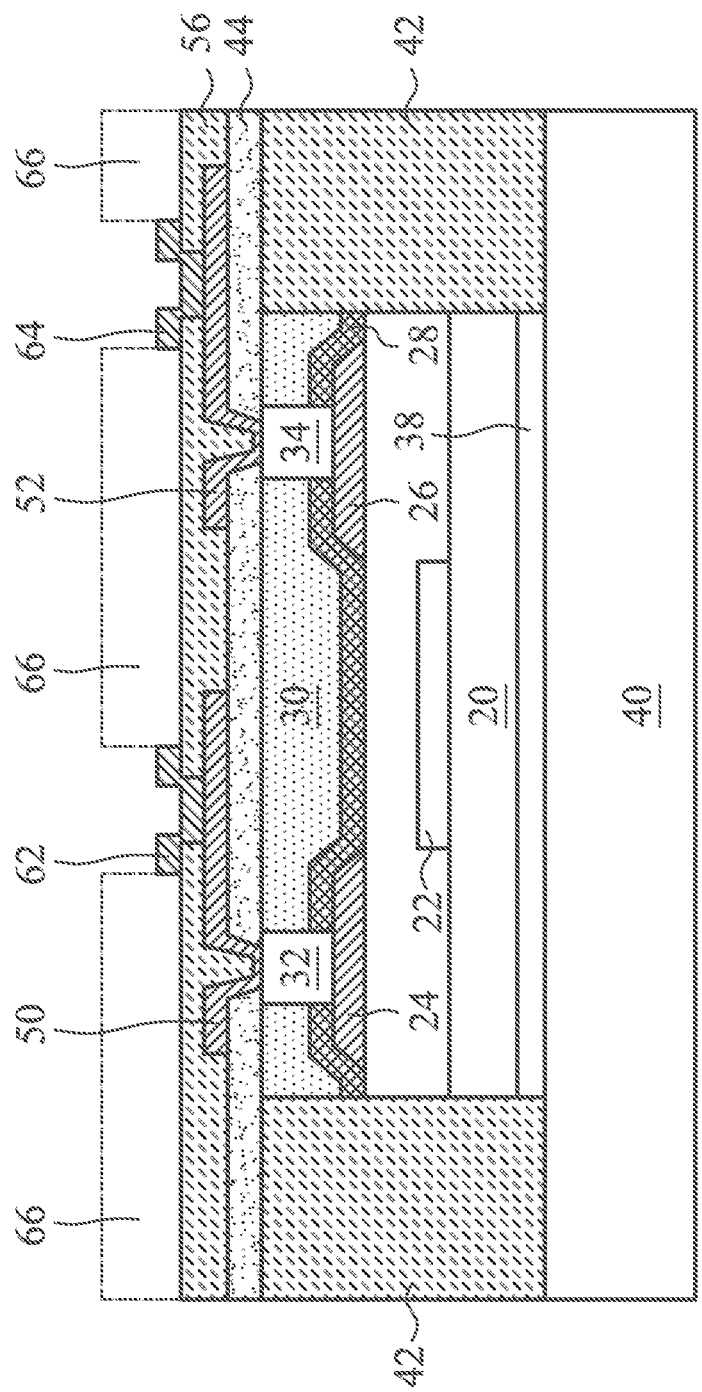

The formation of a first UBM 62 and a second UBM 64 is illustrated in FIG. 11. The first UBM 62 may be formed to extend into the third opening 58 and in electrical contact with the first PPI 50, and the second UBM 64 may be formed to extend into the fourth opening 60 and in electrical contact with the second PPI 52. The first and second UBMs 62 and 64 may comprise one or more layers of conductive material. There are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first and second UBMs 62 and 64. Photo resist 66 is formed and patterned, so that some portions second dielectric layer 56 are exposed, and some other portions are covered. A plating process may be performed to plate the materials and layers on the exposed portions of second dielectric layer 56 to form the first and second UBMs 62 and 64. Any suitable materials or layers of material that may be used for the first and second UBMs 62 and 64 are fully intended to be included within the scope of the current application. After the plating process, photo resist 66 may be removed.

Figure 12:
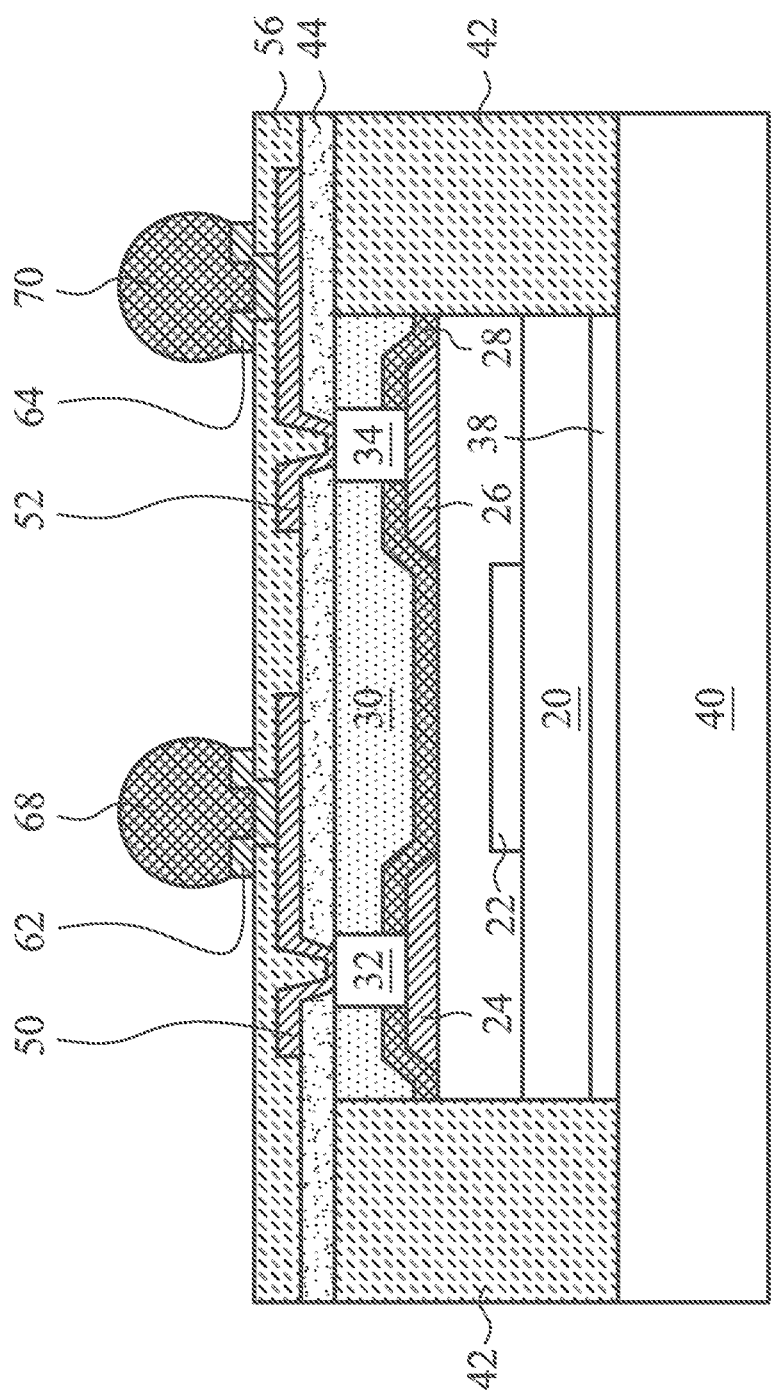
Figure 13:
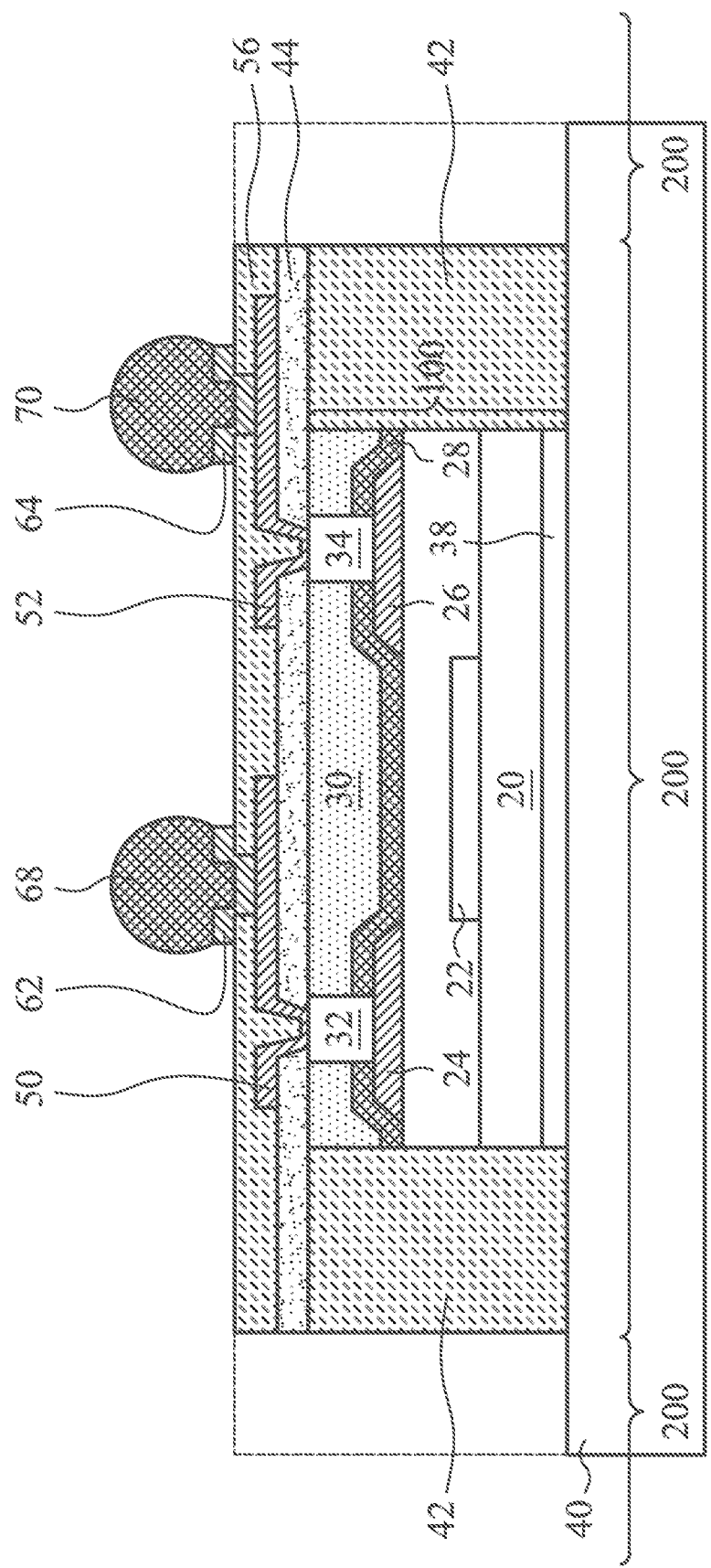

FIG. 12 illustrates the formation of a first connector 68 and a second connector 70 in electrical and physical contact with the first and second UBMs 62 and 64, respectively. In an embodiment, the first and second connectors 68 and 70 may be C4 bumps, microbumps, solder balls, or the like and may comprise a material such as tin, silver, lead-free tin, copper, the like, or a combination thereof. As shown in FIG. 13, there may be a plurality of packages 200 identical to each other on the first carrier substrate 40.

Figure 14:
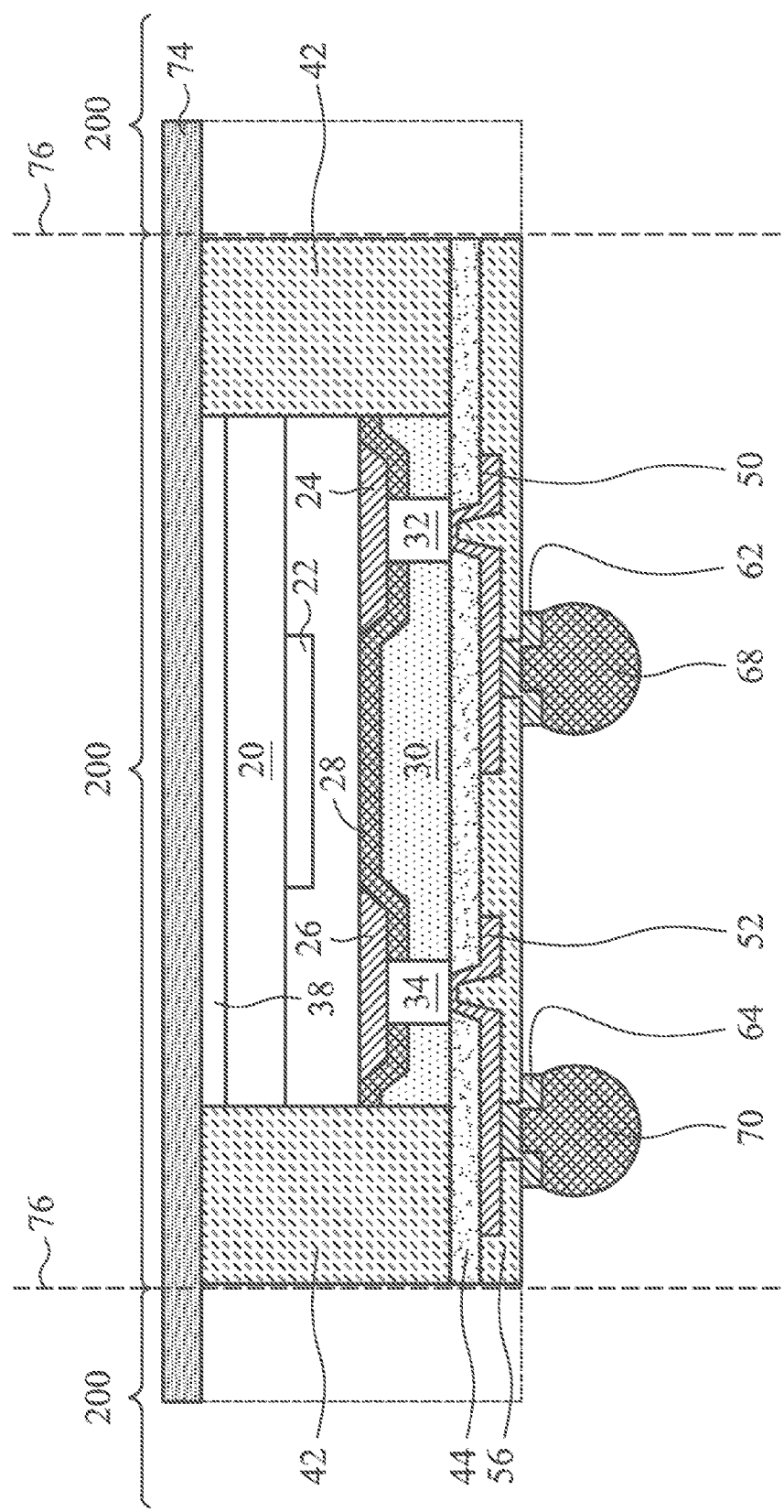

After the first and second connectors 68 and 70 have been formed, the plurality of packages 200 may be de-bonded or removed from the carrier substrate 40 as illustrated in FIG. 14. A coating tape 74 may then be affixed or laminated to the plurality of packages 200 on a same side as the previously removed carrier substrate 40. The coating tape 74 may provide protection and structural support to the underlying packages 200. In some embodiments the coating tape 74 may be affixed using an annealing process.

After the coating tape 74 is affixed to the plurality of packages 200, a functional test may be performed on the plurality of packages 200. The functional test may be performed to verify connectivity to the die 100 through the first PPI 50 and the first UBM 62 via the first connector 68. The functional test may also verify connectivity to the die 100 through the second PPI 52 and the second UBM 64 via the second connector 70. In addition, the functional test may also be performed to verify certain functionality of the plurality of packages 200. In an embodiment, the functional test may be performed on the plurality of packages 200 simultaneously.

After the functional test is performed, the packages 200 may then be singulated along the scribe lines 76 to form an individual package 200. In some embodiments, a dicing tape (not shown) may be utilized during singulation. The singulation may be performed through a cutting or singulation process wherein a mechanical or laser saw may be used to separate multiple instances of the package 200 from each other.

Figure 15:
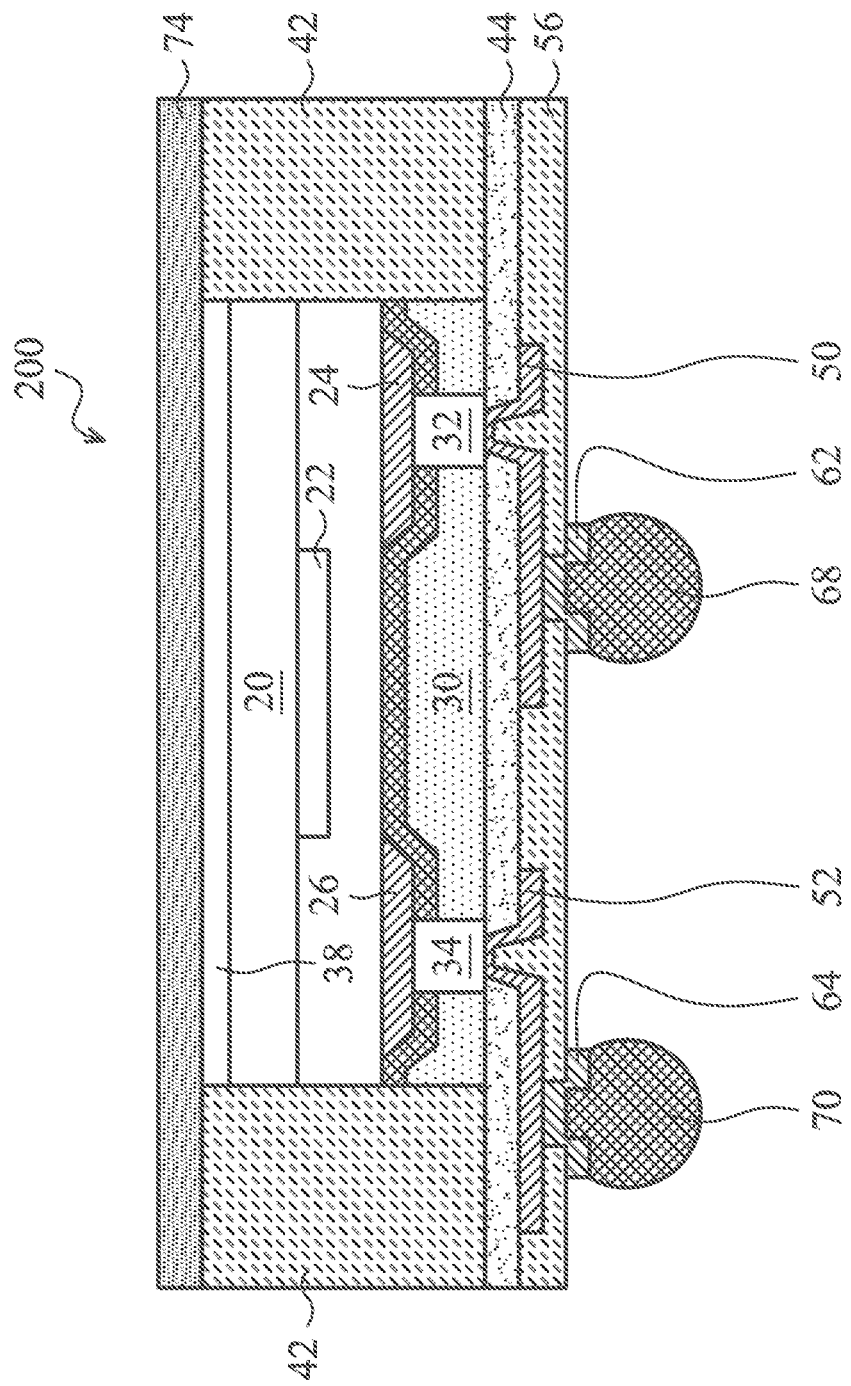
FIG. 15 illustrates an exemplary package according to an embodiment.

FIG. 15 illustrates a single exemplary package 200 after singulation. The exemplary package 200 comprises a die 100 and at least one connector element on a fan-out portion of the package 200. In some embodiments, the package 200 may comprise at least one connector element over and aligned with the die 100. As shown in FIG. 15, the adhesive layer 38 is over and aligned with the die 100, while the coating tape 74 is over and aligned with the entire package 200. Although FIG. 15 illustrates an exemplary package 200 with two connectors (first and second connectors 68 and 70), other embodiments contemplate having a plurality of connectors on the fan-out portion of the package 200 (see the second connector 70 in FIG. 15), and a plurality of connectors over and aligned to the die 100 (see the first connector 68 in FIG. 15).

By using an adhesive layer 38 only on the die 100, the package 200 will have better warp control and the die 100 may have a smaller shift on the first carrier substrate 40. The warp control may be improved up to 60% as found in testing. Also, the total thickness variation of the die 100 will be improved which will enable more accurate grinding end point detection when grinding to expose the first and second metal pillars 32 and 34. Further, the formation of the package 200 requires less adhesive material in the adhesive layer 38 which will reduce the cost of forming the package 200.

An embodiment is a device comprising a semiconductor die, an adhesive layer on a first side of the semiconductor die, and a molding compound surrounding the semiconductor die and the adhesive layer, wherein the molding compound is at a same level as the adhesive layer. The device further comprises a first post-passivation interconnect (PPI) electrically coupled to a second side of the semiconductor die, and a first connector electrically coupled to the first PPI, wherein the first connector is over and aligned to the molding compound.

Another embodiment is a method of forming a semiconductor device comprising forming a die, attaching the die over a dicing tape with an adhesive layer, and singulating the die. The method further comprises de-bonding the die from the dicing tape, attaching the die over a carrier with the adhesive layer, wherein the adhesive layer is coterminous with the die, and molding the die with a polymer, wherein the polymer encircles the die and the adhesive layer.

Yet another embodiment is a method of forming a semiconductor device comprising forming a plurality of dies on a substrate, affixing the plurality of dies to a dicing tape with a glue layer, and singulating the plurality of dies. The method further comprises affixing the plurality of dies to a carrier substrate with the glue layer, wherein at least two dies of the plurality of dies have a separate glue layer between the carrier substrate and the at least two dies, and wherein the separate glue layer is substantially aligned with the at least two dies, and encapsulating the plurality of dies with a molding compound, wherein a portion of the molding compound is between the at least two dies.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a semiconductor die comprising:
      a first bond pad over a substrate;
      a first passivation layer over the substrate and the first bond pad, the first passivation layer being a substantially conformal layer, the first passivation layer having a bottom surface substantially coplanar with a bottommost surface of the first bond pad;
      a second passivation layer over the first passivation layer; and
      a first metal pillar directly contacting the first bond pad and extending through the first passivation layer and the second passivation layer;
   an adhesive layer on a first side of the semiconductor die;
   a molding compound surrounding the semiconductor die and the adhesive layer, wherein the molding compound is at a same level as the adhesive layer, the molding compound consisting essentially of a polymer or an epoxy;
   a first post-passivation interconnect (PPI) directly contacting the first metal pillar, the first metal pillar electrically coupling the first bond pad to the first PPI; and
   a first connector electrically coupled to the first PPI, wherein the first connector is over and aligned to the molding compound.

2. The device of claim 1, wherein the molding compound further comprises a portion at a same level as the first metal pillar.

3. The device of claim 1 further comprising:
   a second bond pad over the substrate;
   a second PPI electrically coupled to the second bond pad; and
   a second connector electrically coupled to the second PPI, wherein the second connector is over and aligned to the semiconductor die.

4. The device of claim 1 further comprising a tape adhered to the adhesive layer and the molding compound.

5. The device of claim 1, wherein a top surface of the molding compound is a continuous material from the semiconductor die to an edge of the device.

6. The device of claim 1, wherein the adhesive layer comprises a die attach film.

7. The device of claim 1, wherein second passivation layer has a different material composition than the first passivation layer.

8. The device of claim 1, wherein the first PPI has a non-planar top surface, the first connector directly adjoining the top surface of the first PPI.

9. The device of claim 1 further comprising a dielectric layer over the second passivation layer, the molding compound, and the first metal pillar, the first PPI extending through the dielectric layer and along a top surface of the dielectric layer.

10. A semiconductor package comprising:
    a die, the die further comprising:
       a bond pad over a substrate;
       a first passivation layer directly adjoining a top surfaces of the bond pad, the first passivation layer having a bottom surface substantially coplanar with a bottommost surface of the bond pad;
       a second passivation layer on the first passivation layer; and
       a metal pillar on the bond pad, the metal pillar extending through the first passivation layer and the second passivation layer;
    an adhesive layer on a first side of the die;
    a molding compound surrounding the die and the adhesive layer, the molding compound having a top surface that is a continuous material from the die to an edge of the semiconductor package, wherein surfaces of the metal pillar, the second passivation layer, and the molding compound are substantially coplanar;
    a conductive interconnect electrically coupled to a second side of the die, the metal pillar electrically coupling the bond pad to the conductive interconnect; and a conductive connector adjoining and electrically coupled to the top surface of the conductive interconnect, the conductive connector being over and aligned to the molding compound.

11. The semiconductor package of claim 10, wherein the molding compound comprises a polymer, and the adhesive layer comprises a die attach film.

12. The semiconductor package of claim 10, wherein the metal pillar directly contacts the bond pad, and wherein the conductive interconnect directly contacts the metal pillar.

13. The semiconductor package of claim 10 further comprising a tape adhered to the adhesive layer and the molding compound.

14. The semiconductor package of claim 10, wherein the conductive connector comprises an under bump metallization on and electrically coupled to the top surface of the conductive interconnect and a conductive bump coupled to the under bump metallization.

15. The semiconductor package of claim 10, wherein the die further comprises a second conductive interconnect, wherein the semiconductor package further comprises a second conductive connector adjoining and electrically coupled to the second conductive interconnect, the second conductive connector being over and aligned to the substrate of the die.

16. A semiconductor package comprising:
   a die comprising:
      a bond pad on a substrate;
      a first passivation layer over the bond pad and the substrate, the first passivation layer directly adjoining a top surface of the bond pad, the first passivation layer having a bottom surface substantially coplanar with a bottommost surface of the bond pad;
      a second passivation layer on the first passivation layer; and
      a metal pillar extending through the first and second passivation layers, the metal pillar being coupled to the bond pad;
   an adhesive layer on a first side of the die;
   a molding compound surrounding the die and the adhesive layer, the molding compound having a top surface that is substantially coplanar with a top surface of the metal pillar and a top surface of the second passivation layer, the top surface of the molding compound being a continuous material from the die to an edge of the semiconductor package;
   a conductive interconnect electrically coupled to the metal pillar of the die; and
   a conductive connector electrically coupled to the conductive interconnect, the conductive connector being over and aligned to the molding compound.

17. The semiconductor package of claim 16, wherein the molding compound consists essentially of polymer or an epoxy, and wherein the adhesive layer comprises a die attach film.

18. The semiconductor package of claim 16 further comprising a tape adhered to the adhesive layer and the molding compound.

19. The semiconductor package of claim 16, wherein the metal pillar directly contacts the bond pad, and wherein the conductive interconnect directly contacts the metal pillar.

20. The semiconductor package of claim 16, wherein the top surfaces of the molding compound and the metal pillar are substantially coplanar with a top surface of the second passivation layer.

* * * * *